(12) United States Patent
Ito et al.

(10) Patent No.: US 7,057,891 B2
(45) Date of Patent: Jun. 6, 2006

(54) HEAT DISSIPATION STRUCTURE

(75) Inventors: Kazutoshi Ito, Kariya (JP); Takamasa Oguri, Toyoake (JP); Akihiro Mizutani, Nagoya (JP)

(73) Assignee: DENSO Corporation, Kariya (JP)

( * ) Notice: Subject to any disclaimer, the term of this patent is extended or adjusted under 35 U.S.C. 154(b) by 50 days.

(21) Appl. No.: 10/846,871

(22) Filed: May 14, 2004

(65) Prior Publication Data

US 2004/0233642 A1    Nov. 25, 2004

(30) Foreign Application Priority Data

May 19, 2003  (JP) .............................. 2003-141080
Feb. 23, 2004  (JP) .............................. 2004-046826

(51) Int. Cl.
*G06F 1/20* (2006.01)

(52) U.S. Cl. ...................... 361/687; 361/720; 428/458; 174/255

(58) Field of Classification Search ........ 361/679–687, 361/724–727, 705, 709, 720; 428/458; 417/436; 310/330; 174/255, 258

See application file for complete search history.

(56) References Cited

U.S. PATENT DOCUMENTS

| 5,396,403 | A  | * | 3/1995 | Patel ........................... 361/705 |
| 6,552,906 | B1 |   | 4/2003 | Kanada ....................... 361/705 |
| 6,905,774 | B1 | * | 6/2005 | Takahashi et al. ........... 428/458 |

FOREIGN PATENT DOCUMENTS

| JP | 5-335452      |   | 12/1993 |
| JP | 407311472 A   | * | 11/1995 |
| JP | 2002-083912   |   | 3/2002  |
| JP | 2002-088225   |   | 3/2002  |
| JP | 2002-217346   |   | 8/2002  |
| JP | 2003-027080   |   | 1/2003  |

* cited by examiner

*Primary Examiner*—Hung Van Duong
(74) *Attorney, Agent, or Firm*—Harness, Dickey & Pierce, PLC

(57) ABSTRACT

A heat dissipation structure includes a heat-producing electronic component on a substrate, a thermally conductive case, and grease. The electronic component and the substrate are housed in the case. The grease is provided between the case and the electronic component or the substrate for transmitting heat produced by the electronic component to the case. The case has contact surfaces that contact with the grease. The contact surfaces have free energy equal to or higher than 20 mN/m and roughness equal to or larger than 1.0 μm.

28 Claims, 5 Drawing Sheets

| | CASE | | | D (mm) | EVALUATION |
|---|---|---|---|---|---|
| | MATERIAL | E (mN/m) | Rz (μm) | | |
| SAMPLE 1 | TEFLON | 19.3 | 1.42 | 12 | × |
| SAMPLE 2 | CELLOPHANE | 25.1 | 0.75 | 2 | × |
| SAMPLE 3 | ROLLED ALUMINUM | 31.0 | 0.79 | 5 | × |
| SAMPLE 4 | ROLLED ALUMINUM | 37.1 | 0.94 | 0.5 | × |
| SAMPLE 5 | ROLLED ALUMINUM | 35.9 | 2.51 | 0 | ○ |
| SAMPLE 6 | DIECAST ALUMINUM | 34.6 | 4.25 | 0 | ○ |
| SAMPLE 7 | ROLLED METAL | 40.5 | 2.94 | 0 | ○ |

| h | 0 | 0.1 | 0.166 | 0.324 | 0.332 |
|---|---|---|---|---|---|
| 50CYCLE-1 | 1.0 | 1.5 | 1.5 | 1.0 | 1.0 |
| 50CYCLE-2 | 1.5 | | | | |
| 50CYCLE-3 | 2.0 | | | | |
| Ave | 1.5 | 1.5 | 1.5 | 1.0 | 1.0 |
| 300CYCLE-1 | 9.0 | 1.5 | 1.5 | 1.0 | 1.0 |
| 300CYCLE-2 | 8.0 | | | | |
| 300CYCLE-3 | 6.0 | | | | |
| Ave | 7.7 | 1.5 | 1.5 | 1.0 | 1.0 |

| $\theta$ [°] | 0 | 0.92 | 1.38 | 1.83 | 2.29 |
|---|---|---|---|---|---|
| 50CYCLE-1 | 1.0 | 1.0 | 1.0 | 1.0 | 0.5 |
| 50CYCLE-2 | 1.5 | 1.0 | 1.0 | 0.5 | 0.5 |
| 50CYCLE-3 | 2.0 | | | | |
| Ave | 1.5 | 1.0 | 1.0 | 0.8 | 0.5 |
| 300CYCLE-1 | 9.0 | 2.0 | 2.0 | 3.0 | 2.0 |
| 300CYCLE-2 | 8.0 | 3.5 | | 2.0 | 2.0 |
| 300CYCLE-3 | 6.0 | | | | |
| Ave | 7.7 | 2.8 | 2.0 | 2.5 | 2.0 |

HEAT DISSIPATION STRUCTURE

CROSS REFERENCE TO RELATED APPLICATION

This application is based on and incorporates herein by reference Japanese Patent Applications No. 2003-141080 filed on May 19, 2003 and No. 2004-046826 filed on Feb. 23, 2004.

FIELD OF THE INVENTION

The present invention relates to a heat dissipation structure for an electronic component.

BACKGROUND OF THE INVENTION

In an electronic circuit, heat radiated from a heat producing component such as a power transistor is usually dissipated by a heat sink mounted on the component. However, mounting such a heat sink is a costly process and therefore a heat dissipation structure having the heat sink cannot be reduced in cost. Furthermore, the heat sink cannot be used for dissipating heat produced by the surface mount device.

To solve the problems, a case for housing an electronic component and a circuit substrate is used as a heat sink and the substrate is thermally coupled with the case via a heat dissipation member. Heat dissipation structures including grease as a heat dissipation member are proposed in JP-A-2002-83912,JP-A-2002-93962,JP-A-2002-217346, and JP-A-5-335452. The grease is easily applied to electronic components because of its flexibility and the thermal coupling between a case and the electronic component or a substrate is appropriately maintained. Moreover, thermal stress is not applied to the electronic component because the grease is not cured.

However, it is difficult to retain the grease in a predetermined position due to its flow ability when vibrations occur. The heat dissipation ability of the grease is degraded with time. When the circuit substrate is installed in a vehicle in which temperatures greatly vary, the grease tends to move in the direction of gravitational force during cooling cycles.

In JP-A-2002-93962, a hole is provided in the heat sink for holding the grease when the grease is squeezed out due to a decrease in volume of grease containing space. The volume of grease containing space is decreased when the substrate or the heat sink is warped as a result of cooling cycles. The movement of the grease is reduced by the hole. However, the grease tends to spread over the contact surface of the heat sink faster than to flow into the hole or well. Therefore, the movement of the grease is not properly reduced.

In JP-A-2002-217346 and JP-A-5-335452A, a well is provided in the heat sink or the substrate for holding the grease. The grease is placed in the well so that the movement of the grease over the contact surface is reduced. However, the well becomes an obstacle to installation of the electronic component on the substrate and therefore flexibility in circuit design is reduced. Furthermore, a larger mounting area is required for the substrate.

SUMMARY OF THE INVENTION

The present invention therefore has an objective to provide a heat dissipation structure having grease as a heat dissipation member that remains in a predetermined position and maintains heat dissipating ability for a long time without reducing flexibility in circuit design. A heat dissipation structure of the present invention includes a heat-producing electronic component, a circuit substrate, a thermally conductive case, and grease.

The electronic component is mounted on the substrate. The electronic component and the substrate are housed by the case. The grease is provided between the case and the electronic component or the substrate for transmitting the heat produced by the electronic component to the case. The case has a surface including a contact surface that contacts with the grease. The contact surface has free energy equal to or higher than 20 mN/m and roughness equal to or larger than 1.0 µm. The free energy and the roughness of the contact surface are preferably equal to or higher than 34 mN/m and 2.5 µm, respectively.

When the contact surface has the free energy E equal to or higher than 20 mN/m, preferably 34 mN/m, the grease is more likely to adhere to the contact surface and therefore the grease does not flow. When the contact surface has the roughness equal to or higher than 1.0 µm, preferably 2.5 µm, the surface roughness produces resistance to the movement of the grease. The initial heat dissipation ability of the grease is maintained for a long time since the movement of the grease is reduced by the free energy and the roughness of the contact surface. Therefore, the heat dissipation structure maintains its performance in the heat dissipation.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiments of the present invention will be explained with reference to the accompanying drawings. In the drawings, the same numerals are used for the same components and devices.

First Embodiment

Figure 1:
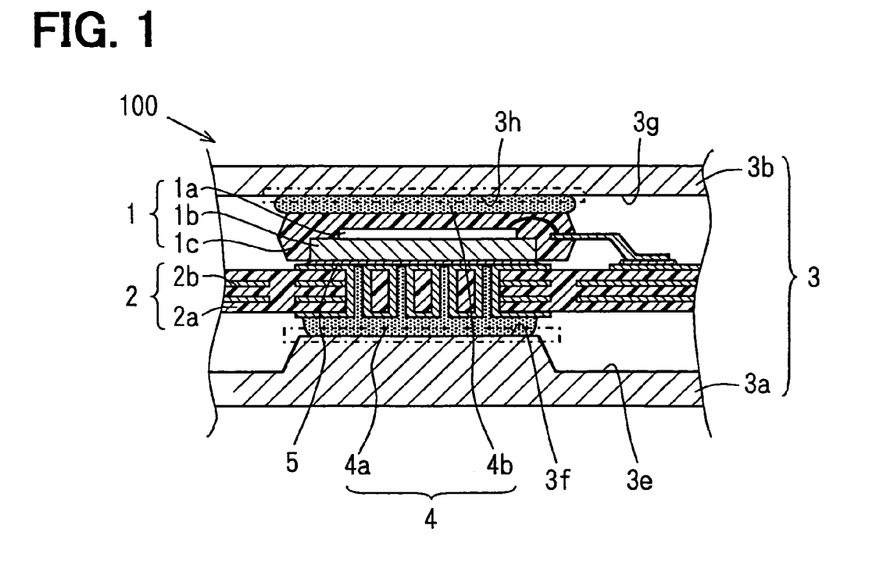
FIG. 1 is a cross-sectional view of a heat dissipation structure according to embodiments of the present invention.

Referring to FIG. 1, a heat dissipation structure 100 includes a heat-producing electronic component 1, a circuit substrate 2, and a case 3, grease 4, and solder 5. The electronic component 1 is constructed of a semiconductor chip 1a that produces heat, a base 1b, and a resin 1c. The semiconductor chip 1a is mounted on the base 1b and molded with the resin 1c. The substrate 2 is a commonly used multilayer printed circuit substrate having an insulating base 2a and conductive patterns 2b formed in multiple layers.

The electronic component 1 is mounted on the substrate 2 by soldering the base 1b to the conductive patterns 2b formed on the surface of the substrate 2. The case 3 having thermal conductivity is constructed of a lower case 3a and an upper case 3b for housing the electronic component and the substrate 2. The grease 4 is provided between the lower case 3a and the substrate 2 and between the upper case 3b and the electronic component 1 for transmitting heat produced by the electronic component 1 to the case 3. The grease 4 provided between the lower case 3a and the substrate 2 is referred to as lower grease 4a. The grease 4 provided between the upper case 3b and the electronic component 1 is referred to as upper grease 4b.

The lower case 3a and the upper case 3b contact with the grease in areas indicated with dashed lined in FIG. 1. Surfaces of the lower case 3a and the upper case 3b in the areas are referred to as contact surfaces 3f and 3h, respectively. The contact surfaces 3f and 3h are treated so that their free energy E and roughness Rz are in ranges predetermined based on results of vibration tests shown in FIG. 2. The roughness Rz is measured by the method of JIS B0601.

Figure 2:
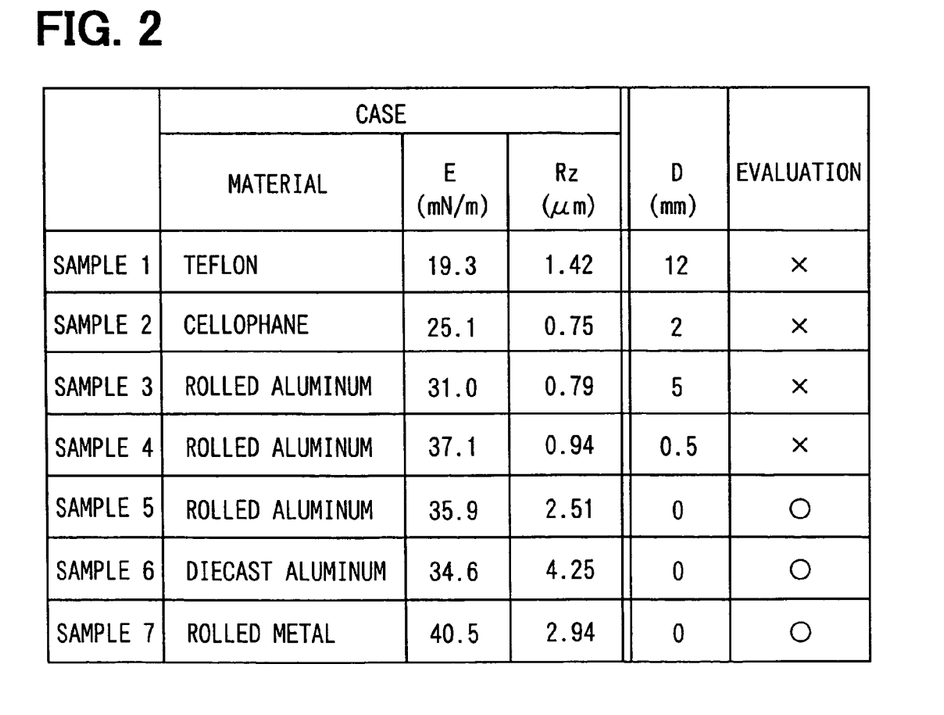
FIG. 2 is a table of vibration test results according to the first embodiment of the present invention.

The grease 4 used in the tests has silicone as a base ingredient and zinc oxide (ZnO) as filler. ZnO is filled into the silicone within a range between 60 wt % and 90 wt % inclusive so that the grease 4 has viscosity in a range between 200 Pa·sec and 500 Pa·sec inclusive. The grease 4 has high thermal conductivity and proper viscosity. Therefore, the thermal conductivity of the grease 4 will be maintained over an extended time period. The viscosity of the grease 4 is measured by a Malcolm spiral viscometer at 10 rpm and 25° C. Moving distances D are measured after applications of vibrations at 20 G for 96 hours.

Rolled aluminum used in samples 3 to 5 has high thermal conductivity and high capability in releasing heat. Therefore, they are commonly used for circuit substrate cases. Rolled aluminum members used in samples 3 to 5 have non-treated surfaces with the surface free energy E in a range between 31.0 mN/m and 37.1 mN/m and the surface roughness Rz in a range between 0.79 µm and 2.51 µm. Die-casting aluminum used in sample 6 is also commonly used for circuit substrate cases. The die-casting aluminum has the surface free energy E of 34.6 mN/m and the surface roughness Rz of 4.25 µm.

Steel usually has larger surface free energy than aluminum. Rolled steel of the sample 7 has the surface free energy of 40.5 mN/m and the surface roughness Rz of 2.94 µm. Resin usually has smaller surface free energy than metal. Teflon (trademark) of sample 1 has the surface free energy E of 1.93 mN/m and the surface roughness Rz of 1.42 µm. Cellophane (trade name) of sample 2 has the surface free energy E of 25.1 mN/m and the surface roughness Rz of 0.75 µm.

The results show the movement of the grease 4 in samples 1 and 2 that have low surface free energy and samples 3 and 4 that have low surface roughness Rz. In sample 5 that has large surface roughness Rz, sample 6 that uses rolled aluminum, and sample 7 that uses rolled metal, the movement of the grease is not confirmed.

From analysis of the results regarding samples 1 through 4, the contact surface 3f, 3h is required to have the free energy E equal to or higher than 20 mN/m and roughness equal to or higher than 1.0 µm to hold the grease 4. It is preferable that the contact surface 3f, 3h has the free energy E equal to or higher than 34 mN/m and the roughness Rz equal to or higher than 2.5 µm to hold the grease 4 according to the analysis of the results regarding samples 5 through 7.

When the contact surface 3f, 3h has the free energy E equal to or higher than 20 mN/m, preferably 34 mN/m, the grease 4 is more likely to adhere to the contact surface 3f, 3e and therefore the grease 4 does not flow. When the contact surface 3f, 3e has the roughness Rz equal to or higher than 1.0 µm, preferably 2.5 µm, the surface roughness produces resistance to the movement of the grease 4. The movement of the grease 4 is reduced by combined effect of the free energy E and the roughness Rz.

In the structure 100, the contact surface 3f, 3h has the free energy E equal to or higher than 20 mN/m, preferably 34 mN/m, and the roughness Rz equal to or higher than 1.0 µm, preferably 2.5 µm. As a result, the movement of the grease 4 is reduced and the initial heat dissipation ability of the grease 4 is maintained for a long time. Namely, the structure 100 maintains its heat dissipation performance.

Furthermore, rolled aluminum of sample 5, die-casting aluminum of sample 6, or steel of sample 7 has the surface free energy E and the surface roughness Rz in those ranges. When such materials are used for the case 3, any special surface treatment is not required to reduce the movement of the grease 4.

Second Embodiment

Figure 3A:
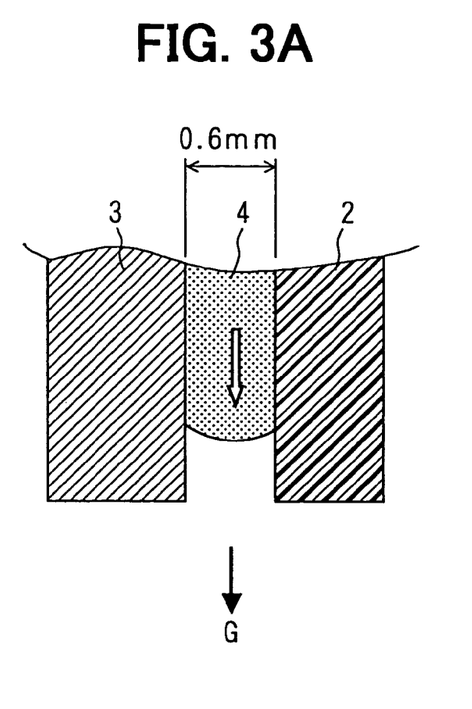
FIG. 3A is a cross-sectional view of the heat dissipation structure about a substrate, a case, and grease included in the structure showing thermal expansion of the grease according the first embodiment.

In a vehicle, circuit substrates are installed in various positions and in conditions that temperature greatly varies. In such conditions, the grease tends to move in the direction of gravitational force due to a cooling cycle. For example, when the temperature changes from 25° C. to 105° C., the grease 4 thermally expands in the direction indicated with a white arrow in FIG. 3A. The thermal stress that is applied to the grease 4 immediately before the grease starts moving is analyzed by the finite element method. The arrangement of the substrate 2, the case 3 and the grease 4 and the conditions of the grease 4 in the analysis are shown in FIG. 3A.

Figure 3B:
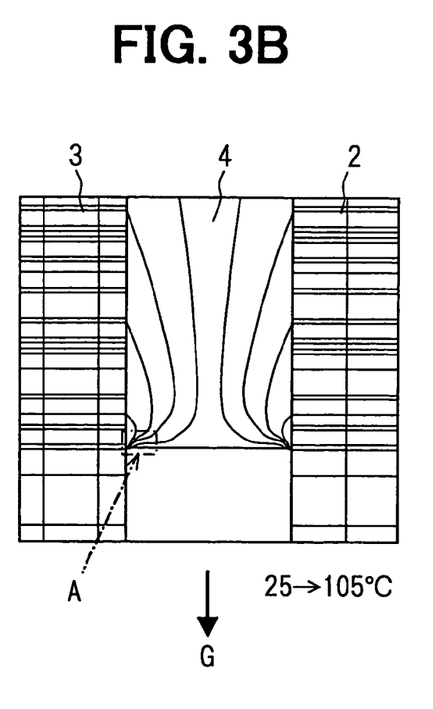
FIG. 3B is a distribution chart of shear stress on surfaces of the substrate and the case according to the first embodiment.

When the grease 4 thermally expands, shear stresses are produced as shown in FIG. 3B. The stress concentration occurs around edges of the contact surfaces of the grease 4.

Figure 3C:
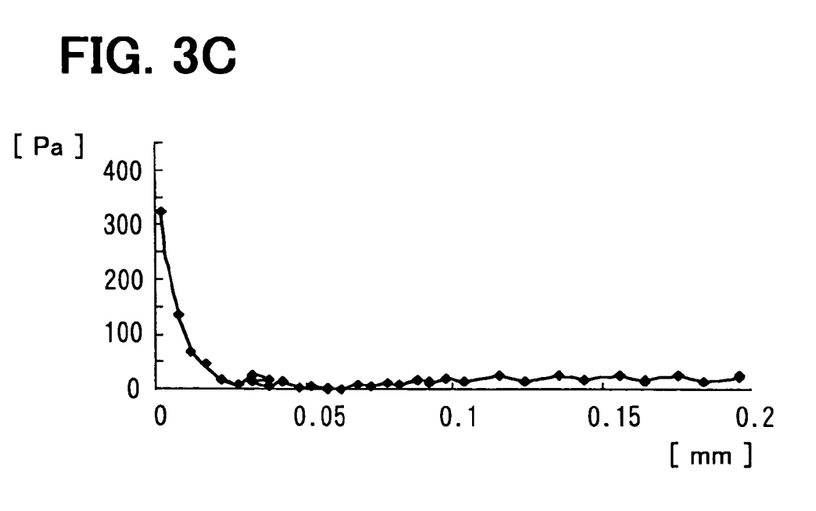
FIG. 3C is a graph of the shear stress in area A indicated by dashed lines in FIG. 3B according to the first embodiment.

The contact surfaces are surfaces that contact with the substrate 2 or the case 3. The edge of the contact surface that contacts with the case 3 is indicated with by alternate long and short dashed lines and referred to as area A. The relationship between a level of the shear stress in the area A and a distance from the contact surface is shown in FIG. 3C. The stress concentration occurs in an area within about 25 μm of the distance.

The grease 4 starts moving when an expansion force of the grease 4 becomes larger than the stress that stops the grease 4 from moving. The grease 4 does not move back to its original position even when the temperature has decreased. As a result, the grease 4 moves according to progress of the cooling cycle. The movement of the grease 4 is more noticeable when the substrate 2 or the case 3 is arranged at an angle with respect to the direction of gravitational force G than it is horizontally arranged. When the substrate 2 or the case 3 is arranged at 90 degrees, the movement of the grease 4 is the most noticeable.

Figure 4A:
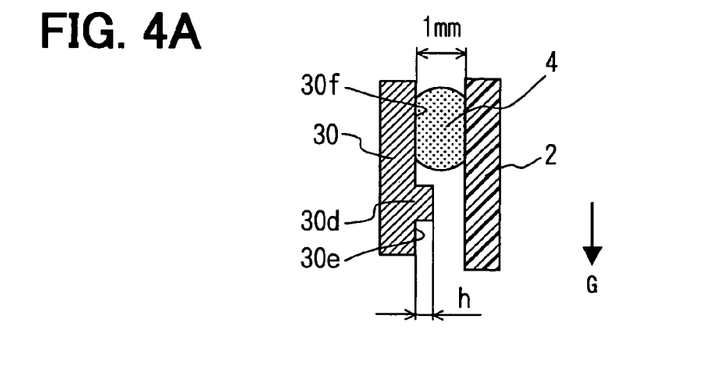
FIG. 4A is a cross-sectional view of the heat dissipation structure about the substrate, a case having a protruding portion, and the substrate according to the second embodiment of the present invention.

To reduce the movement of the grease 4, a protruding portion 30d is provided on a case surface 30e that is opposed to the grease 4. The protruding portion 30d is provided in an area adjacent to the contact surface 30f, namely, near the edge of the grease 4 as shown in FIG. 4A. The case 30 is made of die casting aluminum and used instead of the case 3 of the first embodiment. A protruding portion may be provided on a substrate surface 2e that is opposed to the grease 4. The height H of the protruding portion 30d from the surface 30e measures equal to or greater than 25 μm so that the grease 4 does not move further.

Figure 4B:
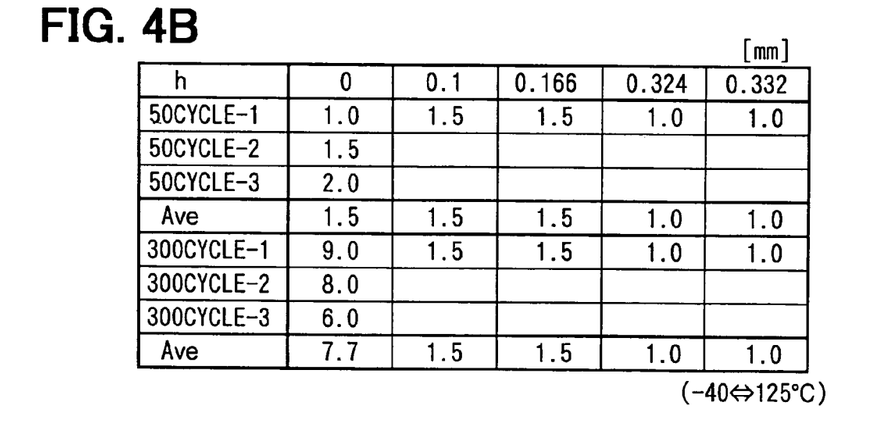
FIG. 4B is a diagram showing results of cooling cycle tests performed on the heat dissipation structure shown in FIG. 4A according to the second embodiment.
Figure 4C:
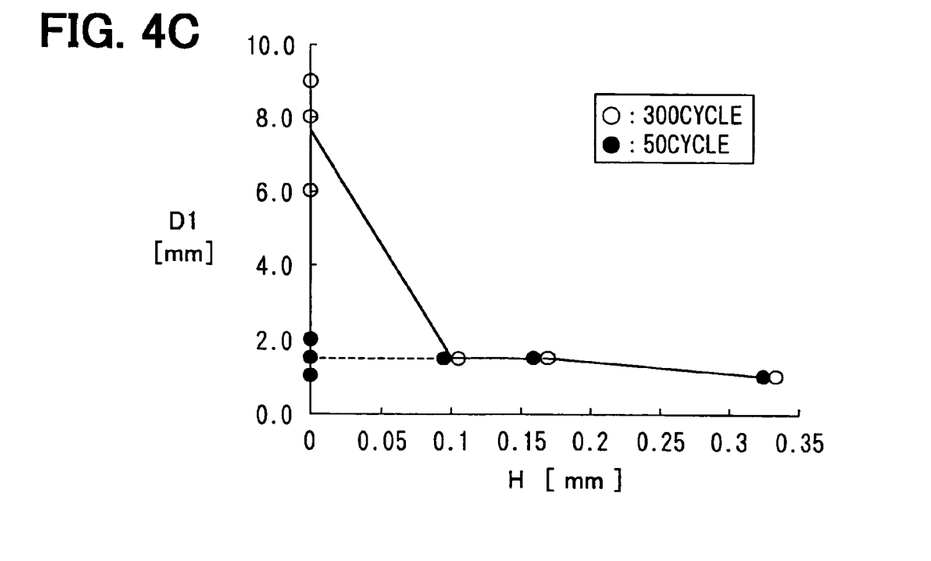
FIG. 4C is a graph showing the results of the cooling cycle tests according to the second embodiment.

Cooling cycle tests are performed on the grease 4, 0.2 ml of which is provided between the substrate 2 and the case 30 in a manner that its thickness is 1 mm as shown in FIG. 4A. In the cooling cycle tests, the temperatures are changed between −40° C. and 125° C. and moving distances D1 of the grease 4 are measured. The results of the cooling cycle tests are shown in FIG. 4B. The moving distances D1 are not very different between the case 30 having the protruding portion 30d and the one having no protruding portion 30d, namely, the height H=0 mm, in 50 cycles. However, an average moving distance D1 in 300 cycles is about 8 mm when the protruding portion 30d is not provided. This is significant movement. The average moving distance is reduced when the protruding portion 30d with the height H of 0.1 mm or greater is provided.

The moving distance D1 is reduced even when the height H of the protruding portion 30d is on the order of 25 μm. Therefore, the protruding portion 30d can be provided in any locations on the substrate 2 or the case 30 without obstructing installation of the electronic components. Namely, flexibility in designing is not reduced.

The protruding portion 30d can be provided in various forms as shown in FIGS. 5A through 5D. The protruding portions 31d through 34d are provided on surfaces 31e through 34e of cases 31 through 34 in areas adjacent to the contact surfaces 31f through 34f, respectively. The cases 31 through 34 are interchangeably used in the heat dissipation structure 100 depending on conditions or requirements of use.

Figure 5A:
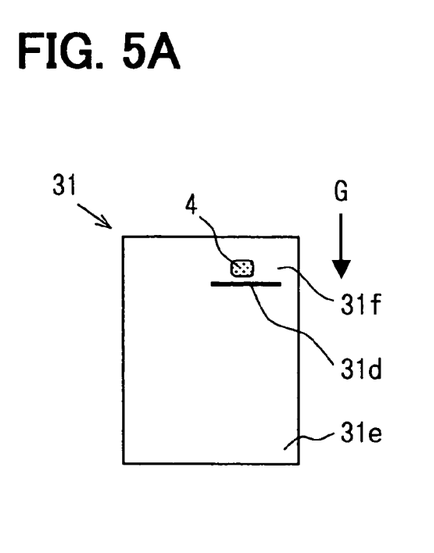
FIG. 5A is a plan view of a case having a protruding portion according to the second embodiment.

The protruding portion 31d is arranged on the case surface 31e perpendicular to the direction of tangential component of gravitational force G below the grease 4. This form is especially preferable when the case 31 is arranged at an angle with respect to the direction of gravitational force G. In such a condition, the grease 4 tends to move in the direction of tangential component of gravitational force G on the surface 31e. Thus, the movement of the grease 4 can be reduced by the protruding portion 31d that is formed perpendicular to the direction of tangential component of gravitational force G below the grease 4.

Figure 5B:
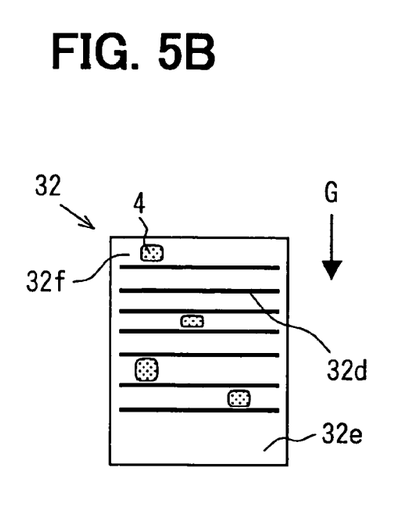
FIG. 5B is a plan view of a case having a protruding portion in a banded pattern according to the second embodiment.

The protruding portion 32d is formed in a banded pattern in the direction perpendicular to the direction of tangential component of gravitational force G on a case surface 32e around the contact. The movement of the grease 4 can be reduced by the protruding portion 32d that covers a larger area of the case 32 in comparison with the protruding portion 31d.

Figure 5C:
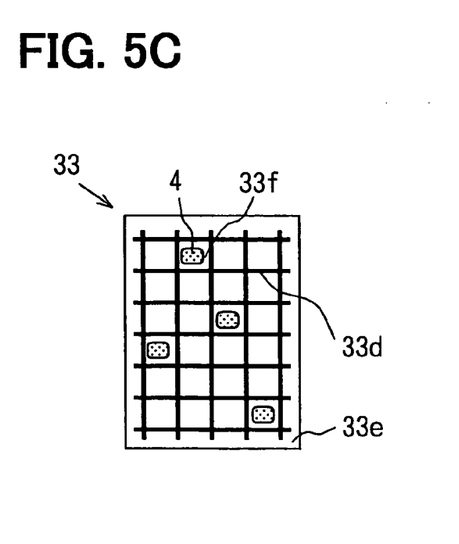
FIG. 5C is a plan view of a case having a protruding portion in a grid pattern according to the second embodiment.
Figure 5D:
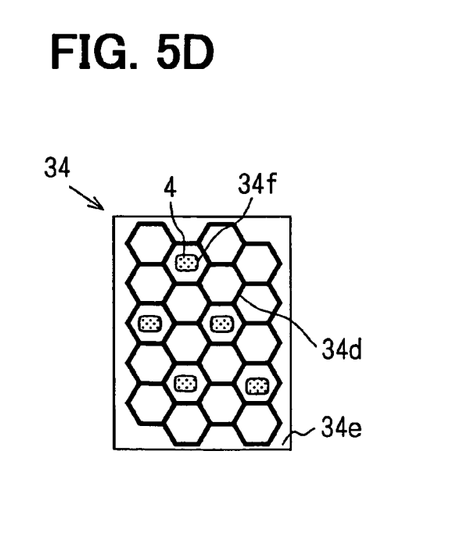
FIG. 5D is a plan view of a case having a protruding portion in a honeycomb pattern according to the second embodiment.

The protruding portion 33d is formed in a grid pattern on the contact surface of the case 33. Likewise, the protruding portion 34d is formed in a honeycomb pattern on the case surface 34e. These forms are especially preferable when installation positions of the cases 33 and 34 with respect to the direction of gravitational force G are unknown. They are also preferable when the cases 33 and 34 may be installed in various positions. In such cases, the protruding portions 33d and 34d can reduce the movement of the grease 4.

The protruding portion 31d, 32d, 33d or 34d may be formed on the contact surface of the substrate 2. The movement of the grease 4 is effectively reduced by the protruding portions 30d–34d when the thickness of the grease 4 is equal to or less than 10 mm.

Third Embodiment

Figure 6A:
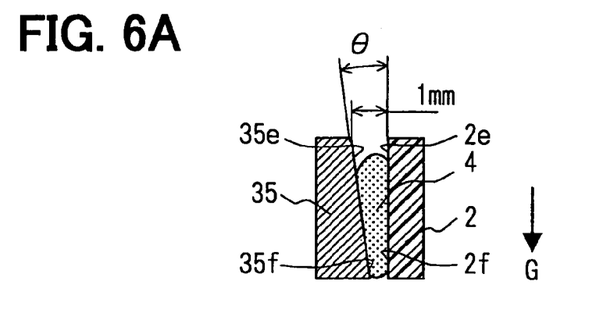
FIG. 6A is a cross-sectional view of the heat dissipation structure about the substrate, a case, and the substrate according to the third embodiment of the present invention.
Figure 6B:
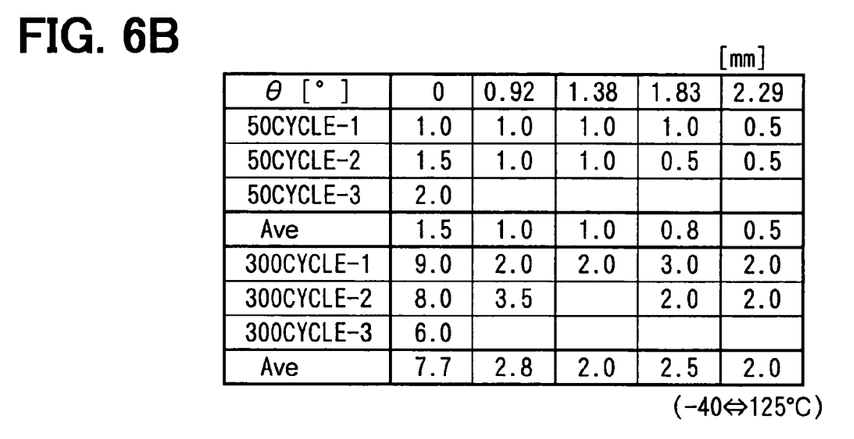
FIG. 6B is a table showing results of cooling cycle tests performed on the heat dissipation structure shown in FIG. 6A according to the third embodiment.

Referring to FIG. 6A, a case 35 and the substrate 2 have flat contact surfaces 35f and 2f that contact with the grease 4 when the grease 4 is provided between them. The case 35 is made of die-casting aluminum. It is tilted relative to the flat contact surface 2f so that a gap between them is smaller at one end (narrow end) than at the opposite end (broad end). 0.2 ml of the grease 4 is provided in the gap in a manner that its thickness is equal to or less than 1 mm and cooling cycle tests are performed. Temperatures are changes between −40° C. and 125° C. and moving distances D2 of the grease 4 are measured in the cooling cycle tests. The results of the cooling cycle tests are shown in FIG. 6B.

When the grease 4 is thermally expanded, the thickness of the grease 4 is small at the narrow end and large at the broad end. In general, flow resistance of fluid becomes large as a flow path becomes narrow. Therefore, the grease 4 expands towards the broad end, namely, the movement of the grease 4 towards the narrow end is reduced. The movement of the grease 4 in the direction of tangential component of gravitational force G on the surface 35e, 2e is reduced when the substrate 2 and the case 35 are arranged so that the cap between them narrows in that direction.

This structure is especially preferable when the substrate 2 or the case 35 is arranged at an angle with respect to the direction of the gravitational force G. In such a condition, the movement of the grease 4 is reduced with this structure.

Figure 6C:
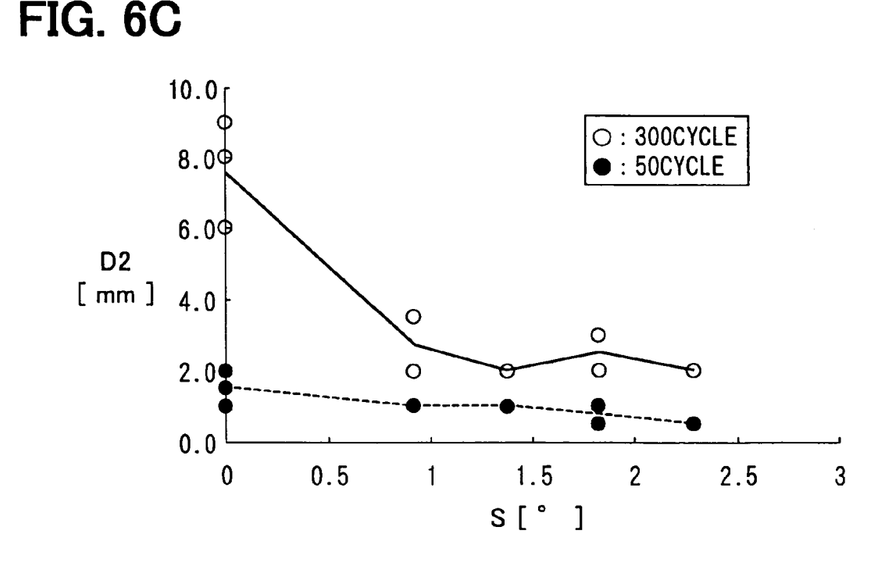
FIG. 6C is a graph showing the results of the cooling cycle tests according to the third embodiment.

The cooling cycle tests are performed under conditions that the case 35 is arranged at different tilt angles θ with respect to the substrate 2. Referring to FIGS. 6B and 6C, moving distances D2 of the grease 4 are small in 300-cycle tests when the tilt angles θ are 1° and larger. According to results of cycle tests in which a larger number of cycles is repeated, a preferred tilt angle θ is 3° and larger.

Neither the substrate 2 nor the case 35 becomes an obstacle to installation of electronic components because its contact surface 2f, 35f is flat. Thus, the flexibility in designing is not reduced.

The present invention should not be limited to the embodiment previously discussed and shown in the figures, but may be implemented in various ways without departing from the spirit of the invention. For example, commonly used grease, viscosity of which is between 50Pa·sec and 2000Pa·sec inclusive, can be used to produce the same effect with the embodiments. The cases may be made of different materials.

What is claimed is:

1. A heat dissipation structure for a heat-producing electronic component comprising:
   a heat-producing electronic component;
   a circuit substrate on which the electronic component is mounted;
   a thermally conductive case for housing the electronic component and the circuit substrate; and
   grease provided between the case and at least one of the electronic component and the circuit substrate for transmitting the heat produced by the electronic component to the case, wherein
   the case has a surface including a contact surface that contacts with the grease, and
   the contact surface has free energy equal to or higher than 20mN/m and roughness equal to or larger than 1.0 μm.

2. The heat dissipation structure according to claim 1, wherein the contact surface has the free energy equal to or higher than 34 mN/m and the roughness equal to or larger than 2.5 μm.

3. The heat dissipation structure according to claim 1, wherein the case is made of any one of rolled aluminum, die-casting aluminum, and steel.

4. The heat dissipation structure according to claim 1, wherein the grease has a viscosity in a range between 50Pa-sec and 2000Pa-sec inclusive.

5. The heat dissipation structure according to claim 1, wherein:
   as least one of the case and the circuit substrate has a protruding portion on a surface that opposed to the grease in an area adjacent to the contact surface; and the protruding portion has a height of 25 μm or higher with respect to the surface.

6. The heat dissipation structure according to claim 1, wherein:
   the case surface and the circuit substrate surface are flat; and
   the case and the circuit substrate are arranged in a manner that the case surface and the circuit substrate surface are opposed to the grease and tilted to each other.

7. The heat dissipation structure according to claim 1, wherein the grease includes silicone as a base component.

8. The heat dissipation structure according to claim 4, wherein:
   the grease includes silicone as a base component and zinc oxide in a range between 60wt % and 90wt % inclusive as a filler; and
   the grease has the viscosity in a range between 200Pa-sec and 500Pa-sec inclusive.

9. The heat dissipation structure according to claim 5, wherein the protruding portion has the height equal to or higher than 0.1 mm.

10. The heat dissipation structure according to claim 5, wherein:
    at least one of the case and the circuit substrate is arranged at an angle with respect to the direction of gravitational force;
    the protruding portion is formed on the surface in a manner that a long axis of the protruding portion is parallel to the surface and perpendicular to a direction of tangential component of gravitational force, which is parallel to the surface; and
    the protruding portion is formed in an area of the surface lower in the direction of the tangential component than the area in which the grease is provided.

11. The heat dissipation structure according to claim 5, wherein the protruding portion is formed in a grid pattern.

12. The heat dissipation structure according to claim 5, wherein the protruding portion is formed in a honeycomb pattern.

13. The heat dissipation structure according to claim 5, wherein the grease has a thickness of 10 mm or smaller.

14. The heat dissipation structure according to claim 6, wherein: at least one of the case and the circuit substrate is arranged at an angle with respect to the direction of gravitational force; and
    the case and the circuit substrate are arranged with a gap between the case surface and the circuit substrate surface in a manner that the gap narrows in the directions of tangential components of gravitational forces, which are parallel to the surfaces.

15. The heat dissipation structure according to claim 6, wherein the case and the circuit substrate are arranged in a manner that the surfaces form an angle of 1° or larger.

16. The heat dissipation structure according to claim 7, wherein the grease has a viscosity in a range between 200 Pa sec and 500 Pa sec.

17. The heat dissipation structure according to claim 10, wherein the protruding portion is formed in a banded pattern.

18. The heat dissipation structure according to claim 16, wherein the roughness of the contact surface is equal to or larger than 2.5 micrometers.

19. A heat dissipation structure for a heat-producing electronic component comprising:
    a heat-producing electronic component;
    a circuit substrate on which the electronic component is mounted;
    a thermally conductive case for housing the electronic component and the circuit substrate; and
    grease provided between the case and at least one of the electronic component and the circuit substrate for transmitting the heat produced by the electronic component to the case, wherein
    any one of the case and the circuit substrate has a protruding portion on a surface in an area adjacent to a contact surface that contacts with the grease, the contact surface included in the surface, and the protruding portion has a height of 25 μm or higher with respect to the surface.

20. The heat dissipation structure according to claim 19, wherein the protruding portion has the height of 0.1 mm or higher.

21. The heat dissipation structure according to claim 19, wherein:
    any one of the case and the circuit substrates is arranged at an angle with respect to the direction of gravitational force;
    the protruding portion is formed on the surface in a manner that a long axis of the protruding portion is parallel to the surface and perpendicular to a direction of tangential component of gravitational force, which is parallel to the surface; and
    the protruding portion is formed in an area of the surface lower in the direction of the tangential component than the area in which the grease is provided.

22. The heat dissipation structure according to claim 19, wherein the protruding portion is formed in a grid pattern.

23. The heat dissipation structure according to claim 19, wherein the protruding portion is formed in a honeycomb pattern.

24. The heat dissipation structure according to claim 19, wherein the grease has a thickness of 10 mm or smaller.

25. The heat dissipation structure according to claim 21, wherein the protruding portion is formed in a banded pattern.

26. A heat dissipation structure for a heat-producing electronic component comprising:

a heat-producing electronic component;

a circuit substrate on which the electronic component is mounted;

a thermally conductive case for housing the electronic component and the circuit substrate; and grease provided between the case and at least one of the electronic component and the circuit substrate for transmitting the heat produced by the electronic component to the case, wherein the case and the circuit substrate have surfaces including contact surfaces that contact with the grease, the surfaces have flat areas adjacent to the contact surfaces, and the case and the circuit substrate are arranged in a manner that the surfaces are tilted toward each other.

27. The heat dissipation structure according to claim 26, wherein the case and the circuit substrate are arranged with a gap between the case surface and the circuit substrate surface in a manner that the gap narrows in the direction of tangential components of the gravitational forces, which are parallel to the surfaces.

28. The heat dissipation structure according to claim 26, wherein the case and the circuit substrate are arranged in a manner that the case surface and the circuit substrate surface form an angle of 1° or larger.

* * * * *